United States Patent
Rein et al.

(10) Patent No.: US 6,665,846 B2
(45) Date of Patent: Dec. 16, 2003

(54) METHOD AND CONFIGURATION FOR VERIFYING A LAYOUT OF AN INTEGRATED CIRCUIT AND APPLICATION THEREOF FOR FABRICATING THE INTEGRATED CIRCUIT

(75) Inventors: Achim Rein, München (DE); Martin Frerichs, München (DE)

(73) Assignee: Infineon Technologies AG, Munich (DE)

( * ) Notice: Subject to any disclaimer, the term of this patent is extended or adjusted under 35 U.S.C. 154(b) by 242 days.

(21) Appl. No.: 09/905,855

(22) Filed: Jul. 13, 2001

(65) Prior Publication Data
US 2002/0016948 A1 Feb. 7, 2002

Related U.S. Application Data

(63) Continuation of application No. PCT/DE00/00023, filed on Jan. 3, 2000.

(30) Foreign Application Priority Data

Jan. 13, 1999 (DE) .......................................... 199 00 980

(51) Int. Cl.$^7$ .............................................. G06F 17/50
(52) U.S. Cl. ....................... 716/5; 716/1; 716/4; 716/5; 716/10; 716/12; 716/19
(58) Field of Search .................. 716/1, 6, 10, 12, 716/19; 706/35; 703/14; 382/145, 260; 257/211

(56) References Cited

U.S. PATENT DOCUMENTS

| | | | |
|---|---|---|---|
| 5,202,841 A | * 4/1993 | Tani ............................... | 716/5 |
| 5,452,224 A | 9/1995 | Smith, Jr. et al. | |
| 5,706,206 A | 1/1998 | Hammer et al. | |
| 5,761,080 A | * 6/1998 | DeCamp et al. ................ | 716/5 |
| 5,828,580 A | 10/1998 | Ho | |
| 6,230,299 B1 | * 5/2001 | McSherry et al. ............. | 716/1 |
| 6,438,729 B1 | * 8/2002 | Ho ................................. | 716/1 |
| 6,536,023 B1 | * 3/2003 | Mohan et al. .................. | 716/5 |

FOREIGN PATENT DOCUMENTS

| | | |
|---|---|---|
| JP | 07288281 A | 10/1995 |
| JP | 07318601 A | 12/1995 |
| JP | 09044550 A | 2/1997 |

OTHER PUBLICATIONS

Castoldi et al., "Three–dimensional analytical solution of the Laplace equation suitable for semiconductor detector design", Nuclear Science, IEEE Transactions on, vol.: 43Issue: 1, Feb. 1996, van Genderen,pp.: 256–265.*

(List continued on next page.)

*Primary Examiner*—Vuthe Siek
*Assistant Examiner*—Helen B Rossoshek
(74) *Attorney, Agent, or Firm*—Laurence A. Greenberg; Werner H. Stemer; Gregory L. Mayback

(57) ABSTRACT

With the assistance of a computer, in order to verify a layout of an integrated circuit, for one or more selected interconnection networks that are contained in the layout, the capacitance with respect to other interconnection networks contained in the layout is calculated as follows: A filter polygon is determined, which corresponds to the form of the selected interconnection network, the dimensions of the filter polygon are enlarged by a predeterminable extent relative to the dimensions of the selected interconnection networks. The portions of the other interconnection networks which overlap the filter polygon are determined, and the capacitance between the selected interconnection networks and the portions of the other interconnection networks which overlap the filter polygon is determined. In order to process large volumes of data, it is advantageous in this case to split the filter polygon into partitioning cells having a predetermined maximum dimension, for which the capacitance between the selected interconnection networks and the portions of the other interconnection networks which overlap the respective partitioning cell is then calculated.

14 Claims, 6 Drawing Sheets

OTHER PUBLICATIONS van Genderen et al., "Hierarchical extraction of 3D interconnect capacitances in large regular VLSI structures", Computer–Aided Design, 1993. ICCAD–93. Digest of Technical Papers., 1993 IEEE/ACM International Conference, pp.: 764–769.*

Le Coz et al.: "A Stochastic Algorithm for High Speed Capacitance Extraction in Integrated Circuits", Solid State Electronics vol. 35, No. 7, 1992, Pergamon Press Ltd. Great Britain, pp. 1005–1012.

Dengi et al.: "Hierarchical 2–D Field Solution for Capacitance Extraction for VLSI Interconnect Modeling", DAC 97, Anaheim, California, ACM 0–89791–920–3/97/06, pp. 1–6.

Horowitz et al.: "Resistance Extraction from Mask Layout Data", IEEE Transactions on Computer–Aided Design, vol. Cad–2, No. 3, Jul. 1983, pp. 145–150.

Zemanian et al.: "Three–Dimensional Capacitance Computations for VLSI/ULSI Interconnections", IEEE Transactions on Computer–Aided Design, vol. 8, No. 12, Dec. 1989, pp. 1319–1326.

Hong et al.: "A Novel Dimension–Reduction Technique for the Capacitance Extraction of 3–D VLSI Interconnects", IEEE Transactions on Microwave Theory and Techniques, vol. 46, No. 8, Aug. 1998, pp. 1037–1044.

Zhu et al.: "An Efficient Algorithm for the Parameter Extraction of 3–D Interconnect Structures in the VLSI Circuits: Domain–Decomposition Method", IEEE Transactions on Microwave Theory and Techniques, vol. 45, No. 8, Aug. 1997, pp. 1179–1184.

* cited by examiner

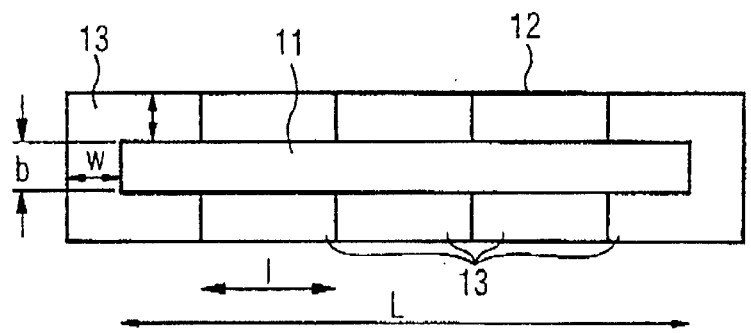
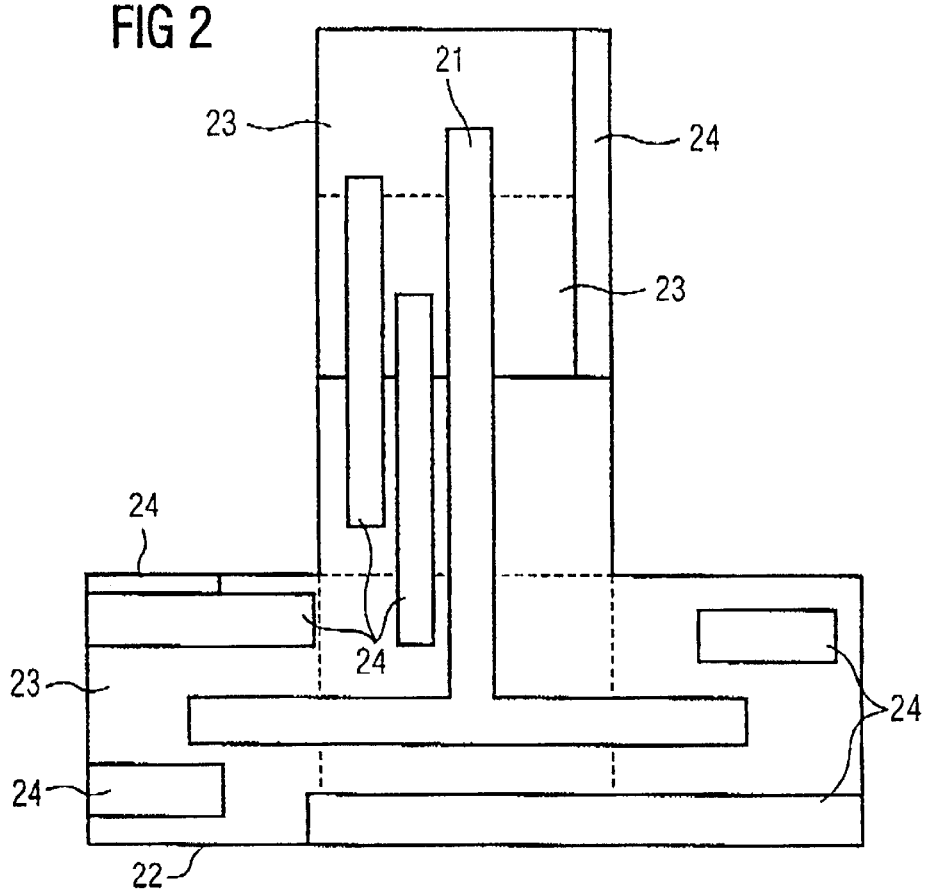

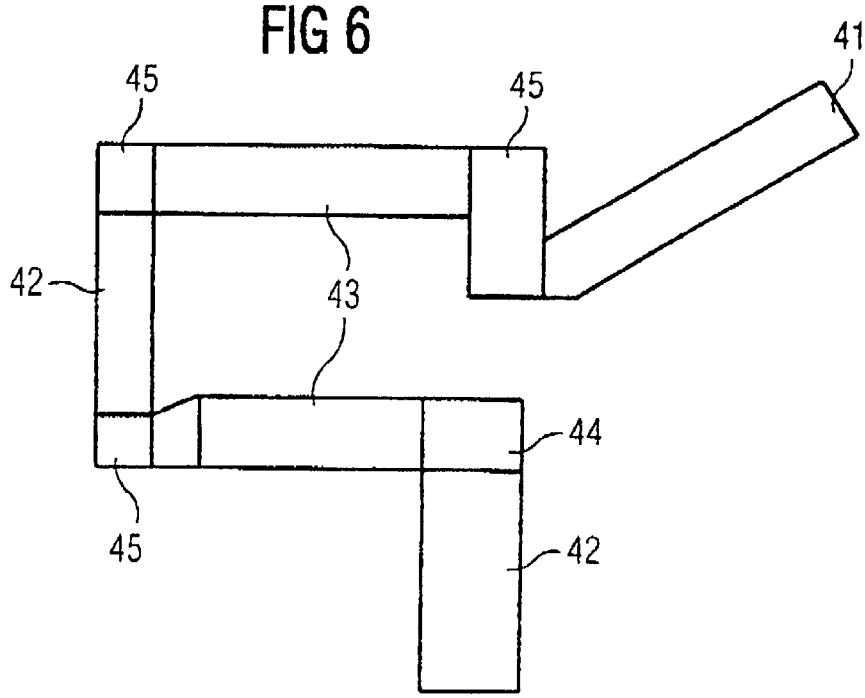
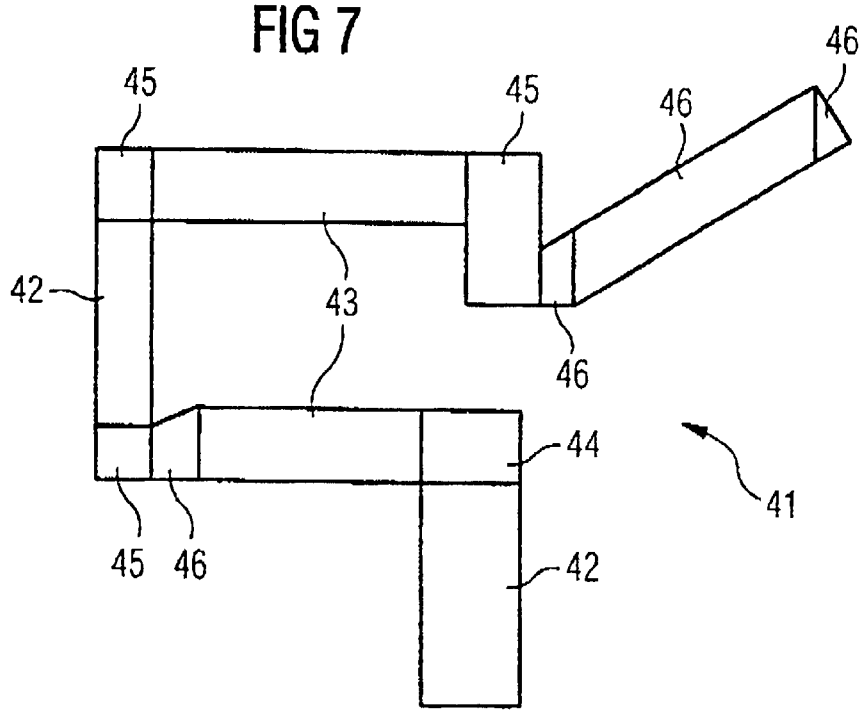

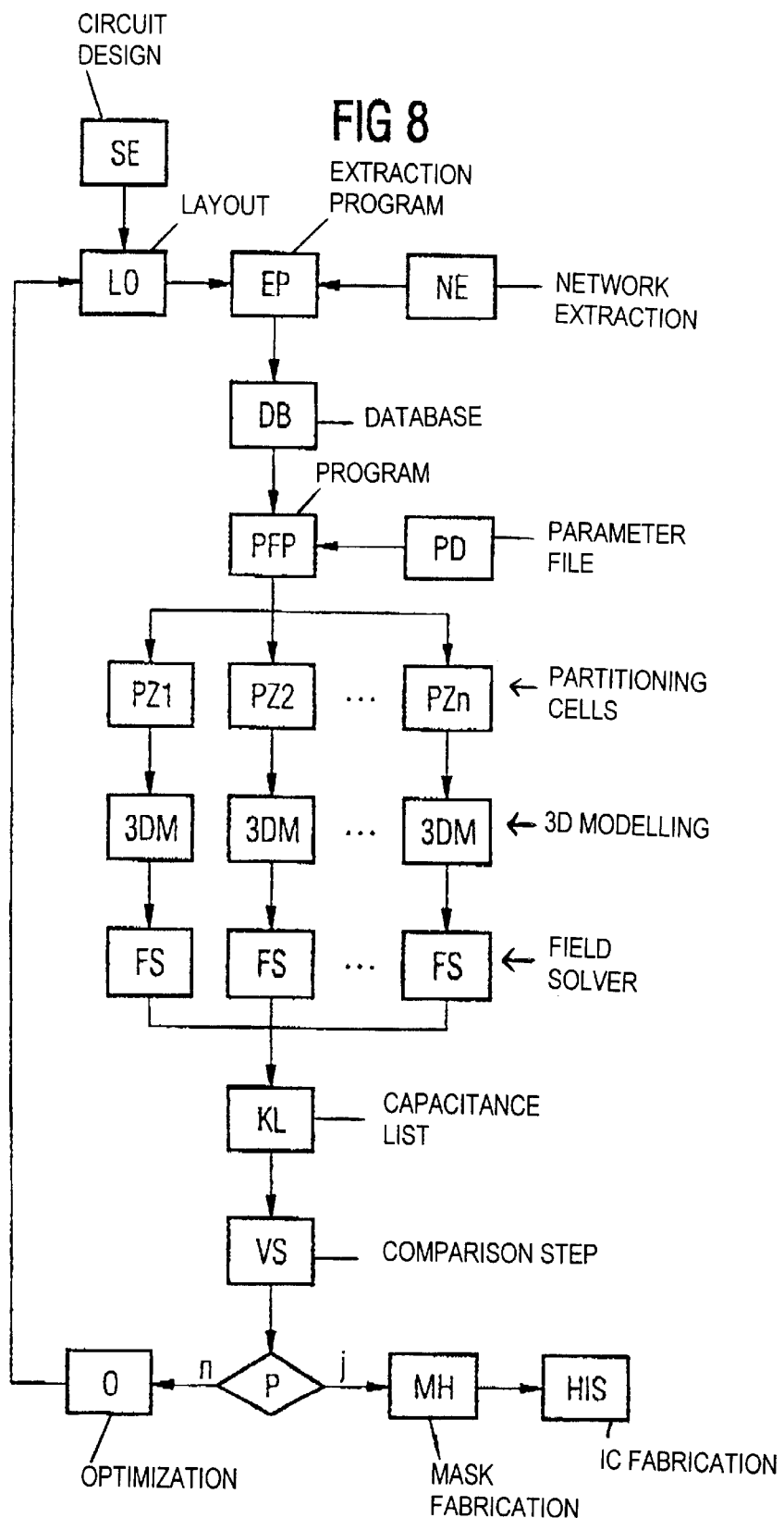

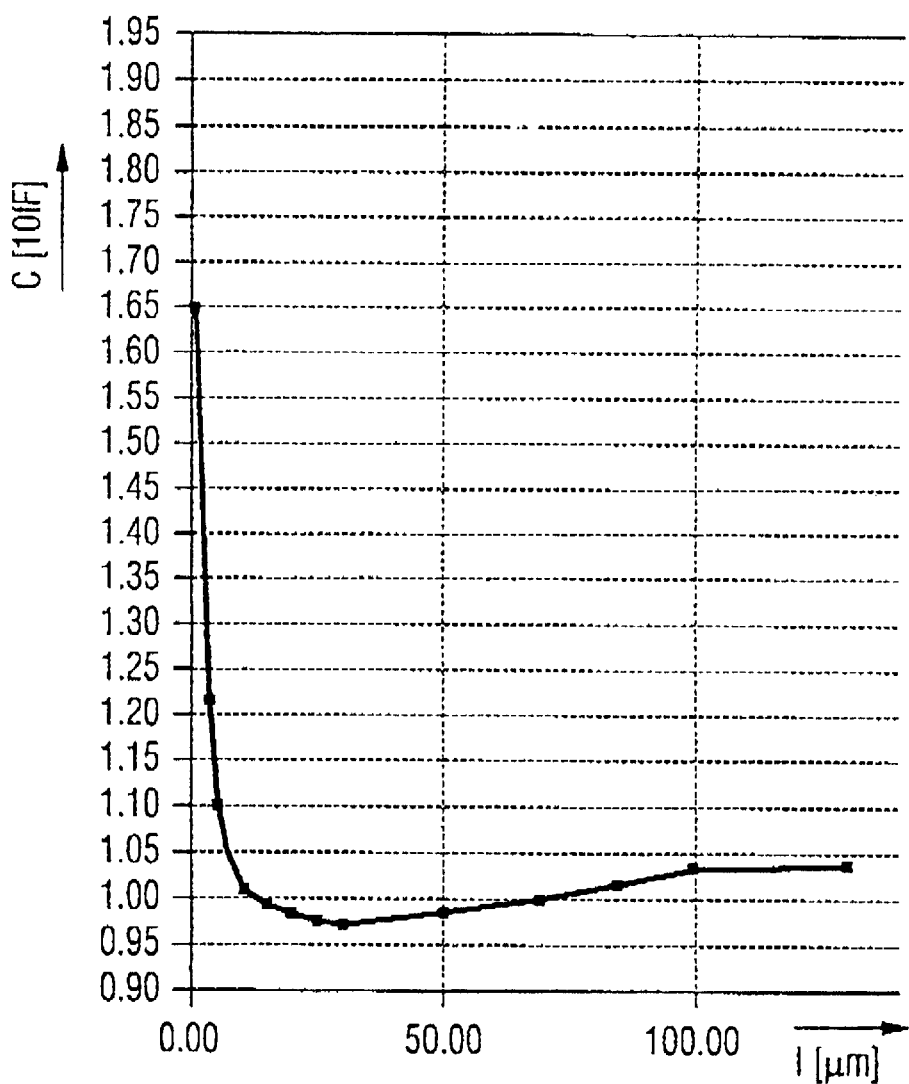

METHOD AND CONFIGURATION FOR VERIFYING A LAYOUT OF AN INTEGRATED CIRCUIT AND APPLICATION THEREOF FOR FABRICATING THE INTEGRATED CIRCUIT

CROSS-REFERENCE TO RELATED APPLICATION

This application is a continuation of copending International Application No. PCT/DE00/00023, filed Jan. 3, 2000, which designated the United States.

BACKGROUND OF THE INVENTION

Field of the Invention

During the realization of large scale integrated circuits, it is customary first to create a circuit design specifying what components are provided and what switching behavior the integrated circuit is intended to have. Proceeding from this circuit design, a layout is created which describes the geometrical form and arrangement of all components in the circuit arrangement. The components include, in particular, doped regions, insulating structures, conductive structures, metalization planes, contacts, etc. The layout is generally created with the aid of a computer and can be present both as a file and as a plan. The layout is the basis used to create mask sets which are subsequently used in the technological fabrication of the integrated circuit.

Due to inaccuracies, design errors and compromises, for instance in the case of minimum dimensions, during the creation of the layout, it is possible that the circuit fabricated according to a layout will have different properties than demanded in the circuit design. In order to ensure that the fabricated circuit functions according to the circuit design as exactly as possible, the layout is frequently subjected to a verification method before a mask set is fabricated which is based on the verified layout. The verification involves examining whether the structures of the integrated circuit which are provided according to the layout actually have the electrical properties specified in the circuit design.

Since the switching speed of integrated circuits is considerably dependent on the interconnection capacitances occurring in the circuit, capacitance calculations are carried out in the course of verification. To that end, interconnection networks, often also called networks, are considered. An interconnection network is understood to be a conductive path within the large scale integrated circuit. The path may be branched and may extend over the entire area of the integrated circuit. Different interconnection networks are insulated from one another. During the capacitance calculation, it is necessary to determine the capacitance between these networks. For high-precision calculations in the deep submicron range, this can be carried out only by programs, so-called field solvers, in which the three-dimensional Laplace equation is solved numerically. In the case of large integrated circuits having a chip area of a few cm$^2$, however, this Laplace equation cannot be handled as a whole by computers available today, for complexity reasons. Therefore, it is customary, during the capacitance calculation, to define partitioning cells for which the three-dimensional Laplace equation can be solved numerically.

It has been proposed (see, for example, Z. Zhu et al., IEEE Transaction on Microwave Theory and Techniques Vol. 45, No. 8, August 1977, pp. 1179 to 1184, Z. Zhu et al., Vol. 46, No. 8, August 1998, pp. 1037 to 1044, E. A. Dengi et al. in proceeding of DAC 1997, pp. 1 to 6 and A. H. Zemanian et al., IEEE Transaction on Computer-Aided Design Vol 8, No. 12, December 1989, pp. 1319 to 1326), for the purpose of dealing with this problem, to carry out a "so-called domain decomposition", in which the partitioning cells are determined by electrostatic boundary conditions of all the interconnection networks. To date, however, this procedure has been expounded in the literature only using relatively small large-scale-integrated circuits, the chip area having been limited to a maximum of 200 $\mu M^2$, since the determination of these electrostatic boundary conditions of all the interconnection networks is complex.

Furthermore, it has been proposed (see, for example, Y. L. Le Coz et al., Solid State Electronics, Vol. 35, No. 7, pp. 1005 to 1012, 1992) to solve the Laplace equation stochastically. However, statistical errors occur in this case. Furthermore, the calculation of coupling portions between different interconnection networks, with the same run time, is possible only in a relatively inaccurate manner. Finally, this method is limited to structures with angles of 45° and 90°.

SUMMARY OF THE INVENTION

It is accordingly an object of the invention to provide a method a configuration for using a computer to verify the layout for fabricating a large scale integrated circuit which overcomes the above-mentioned disadvantageous of the prior art methods and configurations of this general type. In particular, it is an object of the invention to provide such a method that can be carried out with tenable computation complexity even in the case of integrated circuits having chip areas of a few cm$^2$.

With the foregoing and other objects in view there is provided, in accordance with the invention a method for verifying a layout of an integrated circuit, which includes: providing a layout containing a plurality of interconnection networks. One of the plurality of the interconnection networks that are contained in the layout is selected to thereby obtain a selected interconnection network. The selected interconnection network has dimensions. The method includes calculating a capacitance of the selected interconnection network with respect to others of the plurality of the interconnection networks that are contained in the layout. The capacitance is calculated by performing the following steps: determining a filter polygon that surrounds the dimensions of the selected interconnection network; providing the filter polygon with dimensions that are enlarged by a predetermined extent relative to the dimensions of the selected interconnection network; determining portions of others of the plurality of the interconnection networks that overlap the filter polygon; and determining a capacitance between the selected interconnection network and the portions of the others of the interconnection networks that overlap the filter polygon.

In order to verify a layout, an interconnection network contained in the layout is selected. The interconnection network is a continuous structure including conductive elements, such as doped semiconductor regions, doped polycrystalline semiconductor layers, metal layers and the like, which can be arranged in different planes and which touch or overlap one another. The interconnection network may also contain conductive parts of a component. An interconnection network thus constitutes a continuous conductive connection in the integrated circuit. For the selected interconnection network, the capacitance with respect to the other interconnection networks contained in the layout is calculated as follows: a filter polygon is determined, whose form corresponds to the form of the selected interconnection network. The dimensions of the filter polygon is enlarged by a predeterminable extent relative to the dimensions of the selected interconnection network. The filter polygon is thus a geometrical area produced by enlarging the geometrical area of the selected interconnection network by the predeterminable extent.

Afterward, the portions of all the interconnection networks which overlap the filter polygon are determined. These portions may be arranged in the region of the filter polygon both in the same plane as the selected interconnection network and in planes lying above or below it. The capacitance between the selected interconnection network and the portions of the other interconnection networks which overlap the filter polygon is calculated. Portions of the other interconnection networks which are arranged outside the filter polygon are not taken into account during the capacitance calculation. This method exploits the fact that the contribution to the capacitance decreases with the distance between conductive structures. In the method, the contributions which are still to be taken into account during the capacitance calculations are controlled by way of the predeterminable extent.

Since, in the method, only the selected interconnection network is considered as a whole and only the capacitances between the selected interconnection network and the portions of the other interconnection networks which are arranged in the region of the filter polygon are calculated, the computation complexity decreases considerably.

In order to verify layouts of very large integrated circuits, it is advantageous to split the filter polygon into partitioning cells whose dimensions do not exceed a maximum dimension. To that end, the dimensions of the filter polygon are compared with the predetermined maximum dimension and, if a dimension of the filter polygon exceeds the maximum dimension, the filter polygon is split into smaller partitioning cells. Then, for each partitioning cell, the capacitance between the selected interconnection network and the portions of the other interconnection networks which overlap the respective partitioning cell is calculated. The complexity of the three-dimensional Laplace equation to be solved is reduced by way of the size of the partitioning cell. Furthermore, the different partitioning cells can be processed in parallel, so that the result can be determined in a shorter time. The parallelization can be effective using a plurality of processors.

Since the totality of the partitioning cells produces the filter polygon whose form emerged from enlargement of the selected interconnection network, this partitioning in most cases results in dissection of the selected network only within those regions in which homogeneous electrostatic boundary conditions are present.

The splitting of the filter polygon into the partitioning cells can be effected in various ways. Preferably, the filter polygon is split by using vertical and horizontal lines of intersection in the plane of the filter polygon, the lines of intersection in each case intersecting discontinuity points in the contour of the filter polygon. The dimensions of the partial polygons obtained in this way are checked and, if one of their dimensions exceeds the maximum dimension, they are subdivided further. This procedure is based on the so-called "scan-line algorithm".

The size of the maximum dimension on the one hand influences the required computation time for the capacitance calculation, and on the other hand it influences the accuracy that can be achieved during the capacitance calculation. A small maximum dimension is to be striven for with regard to the required computation time; by contrast, a maximum dimension which does not fall below a limit value is to be striven for with regard to the computation accuracy. The maximum dimension is preferably 25 $\mu$m to 50 $\mu$m in the case of a 0.35 $\mu$m technology. In the case of a technology with minimum feature size F, the maximum dimension is between 70 F and 140 F.

If the partitioning results in individual partitioning cells having dimensions which are smaller than a predetermined minimum dimension, then it is advantageous with regard to the computation complexity to combine these small partitioning cells with an adjacent partitioning cell. This also increases the computation accuracy, which is unsatisfactory when the partitioning cells have very small dimensions. The minimum dimension preferably lies between 15 $\mu$m and 25 $\mu$m in the case of a 0.35 $\mu$m technology. In the case of a technology with minimum feature size F, the minimum dimension preferably lies between 40 F and 70 F.

It lies within the scope of the invention for the coordinates of the interconnection networks to be stored as a database in the computer. For each partitioning cell, a file is generated which contains information about the geometry of the respective partitioning cell and about the overlap with the other interconnection networks.

With the foregoing and other objects in view there is provided, in accordance with the invention a configuration for using a computer to verify a layout of an integrated circuit. The configuration includes a processor unit configured to calculate a capacitance in a layout that contains a plurality of interconnection layouts which include a selected interconnection network having dimensions. The capacitance is a capacitance of the selected interconnection network with respect to others of the plurality of the interconnection networks. The processor unit includes means for determining a filter polygon that surrounds the dimensions of the selected interconnection network such that dimensions of the filter polygon are enlarged by a predetermined extent relative to the dimensions of the selected interconnection network. The processor unit includes means for determining portions of other interconnection networks that overlap the filter polygon. The processor unit also includes means for determining capacitance between the selected interconnection network and the portions of the other interconnection networks which overlap the filter polygon.

In other words, in order to fabricate an integrated circuit, proceeding from a circuit design, a layout is created with the aid of a computer. The layout has interconnection networks. In order to verify the layout, an interconnection network is subsequently selected with the aid of a computer, for which interconnection network the capacitance with respect to the other interconnection networks in the region of a filter polygon is calculated according to the method described above. The calculated capacitance is then compared with the circuit design. In the event of losses in performance, the layout is optimized, for example by adapting the widths of the conductive structures. Proceeding from the verified layout, a mask set is fabricated which is used to fabricate the integrated circuit. Verified layout denotes the layout which has the desired electrical properties on account of the verification method or which has been optimized on account of deviations.

It lies within the scope of the invention to select a plurality of interconnection networks for which in each case a filter polygon is determined and the capacitance with respect to the other interconnection networks is determined. In this case, the contributions of the different selected interconnection networks can be calculated in parallel, in particular using a plurality of processes.

With the foregoing and other objects in view there is provided, in accordance with the invention a method for fabricating an integrated circuit, which includes using a computer to create a layout from a circuit design in which the layout has a plurality of interconnection networks having dimensions. One of the plurality of the interconnection networks is selected to thereby obtain a selected interconnection network. The computer is used to verify the layout for the selected interconnection network by calculating the capacitance of the selected interconnection network with respect to others of the plurality of the interconnection networks. The capacitance is calculated by performing the following steps: determining a filter polygon that surrounds the dimensions of the selected interconnection network; providing the filter polygon with dimensions that are enlarged by a predetermined extent relative to the dimensions of the selected interconnection network; determining portions of others of the plurality of the interconnection networks that overlap the filter polygon; determining a capacitance between the selected interconnection network and the portions of the others of the plurality of the interconnection networks that overlap the filter polygon; and comparing the determined capacitance with the circuit design and optimizing the layout in an event of a deviation. After the layout has been verified, a mask set is fabricated and the mask set is used to fabricate an integrated circuit.

Other features which are considered as characteristic for the invention are set forth in the appended claims.

Although the invention is illustrated and described herein as embodied in a method and arrangement for verification of a layout of an integrated circuit with the aid of a computer, and also application thereof for fabrication of an integrated circuit, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIG. 1 shows a linear interconnection network with an associated filter polygon;

FIG. 2 shows a more complex interconnection network with an associated filter polygon and also the portions of other interconnection networks which overlap the filter polygon;

FIG. 6 shows the filter polygon after the definition of third and fourth partitioning cells;

FIG. 7 shows the filter polygon after the definition of fifth partitioning cells;

FIG. 8 shows a flow diagram for fabricating an integrated circuit; and

FIG. 9 shows the capacitance of a linear interconnection network as a function of the length l of a partitioning cell.

DESCRIPTION OF THE PREFERRED EMBODIMENTS

Figure 3:
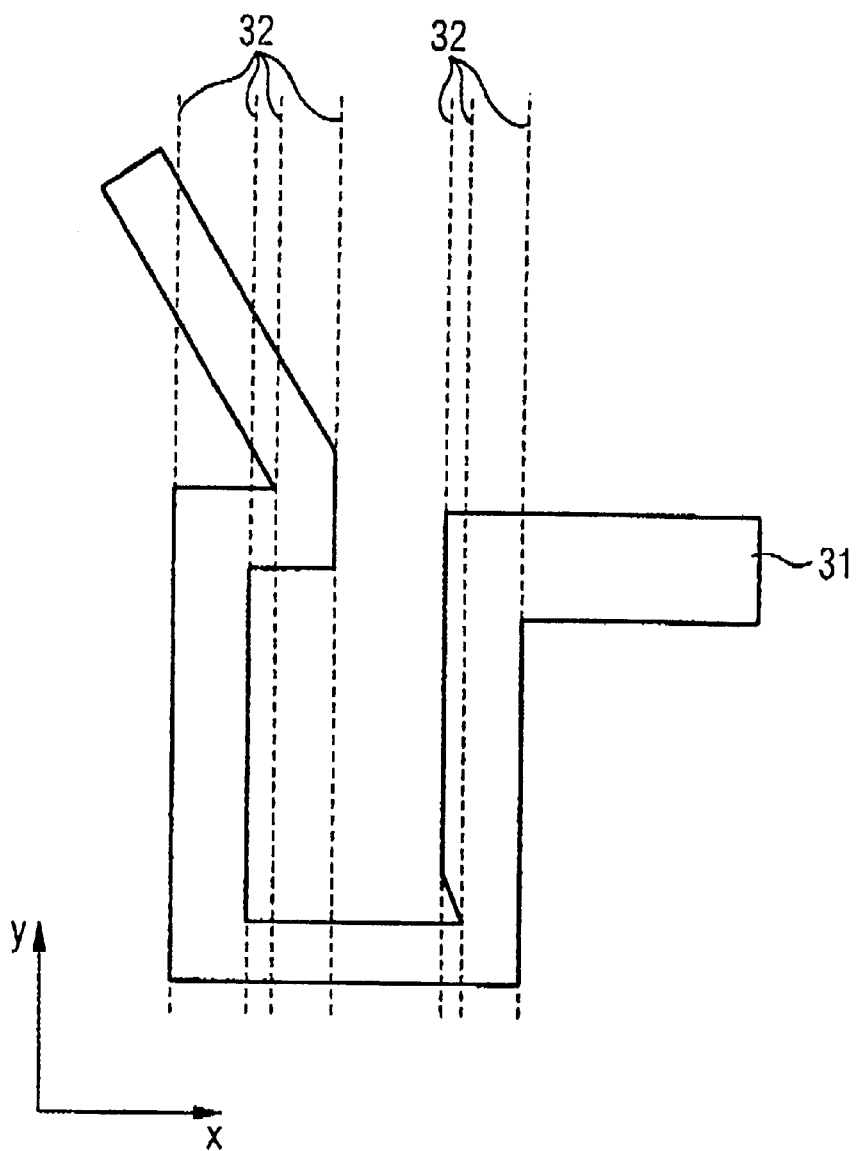
FIG. 3 shows a filter polygon with lines of intersection for partitioning.
Figure 4:
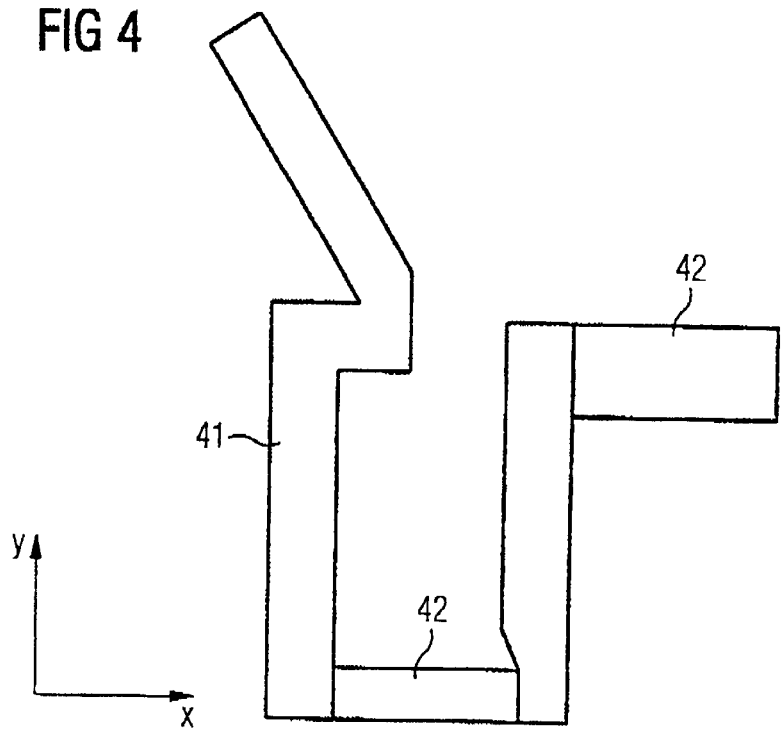
FIG. 4 shows a filter polygon after the definition of first partitioning cells.
Figure 5:
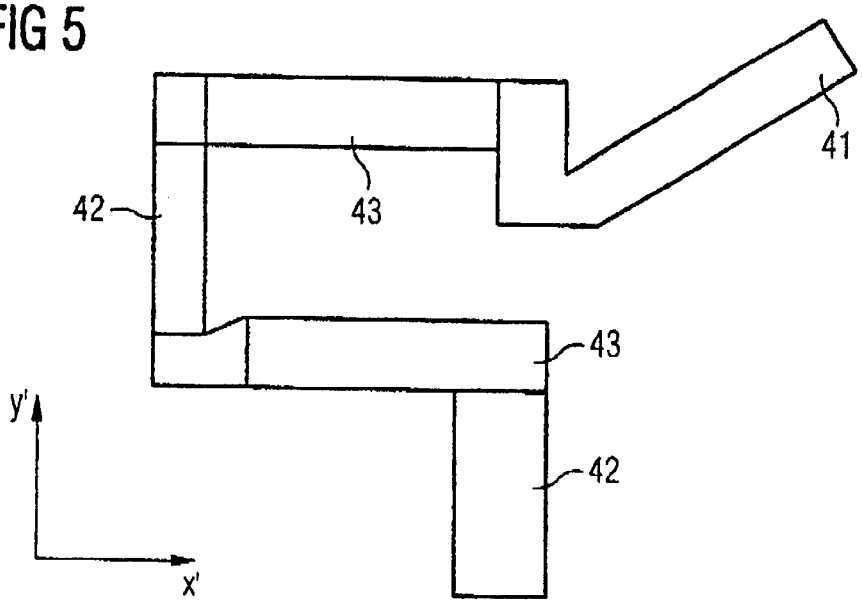
FIG. 5 shows the filter polygon after the definition of second partitioning cells.

Referring now to the figures of the drawing in detail and first, particularly, to FIG. 1 thereof, there is shown a linear interconnection network 11 that has a width b of 0.6 $\mu$m and a length l of 130 $\mu$m. The interconnection network 11 is assigned a filter polygon 12, which is obtained from the interconnection network 11 by enlarging the contour of the interconnection network 11 on both sides by w=5 $\mu$m in each case. The filter polygon 12 thus has a width of b+2 w and a length of L+2 w. The filter polygon 12 is split into partitioning cells 13 which have a length of l=25 $\mu$m parallel to the length l of the interconnection network 11. To that end, the filter polygon 12 is split into rectangles having the length l proceeding from one side (see FIG. 1). In this case, the last partitioning cell may have a length different from the length l if the length of the filter polygon 12 is not an integer multiple of the length l.

A selected interconnection network 21 has an essentially T-shaped cross section (see FIG. 2). The selected interconnection network 21 is assigned a filter polygon 22 which likewise has a T-shaped cross section that is enlarged on both sides by an extent w=5 $\mu$m in each case relative to the dimensions of the selected interconnection network 21. The filter polygon 22 is split into partitioning cells 23, whose dimensions are smaller than a maximum dimension of 25 $\mu$m. The filter polygon 22 overlaps portions 24 of other interconnection networks. The selected interconnection network 21 and the portions 24 of other interconnection networks are contained in one and the same layout.

In order to verify the layout which contains the selected interconnection network 21 and the portions 24 of other interconnection networks, the capacitance between the selected interconnection network and the portions 24 of the other interconnection networks is in each case calculated per partitioning cell 23.

The partitioning of a filter polygon is preferably carried out according to a so-called scan-line algorithm, in which intersection lines 32 running parallel to a y-axis, y are superposed on a filter polygon 31. The intersection lines 32 are placed such that they each run through discontinuities in the contour of the filter polygon 31 (see FIG. 3). In this case, rectangles are determined which are bounded by two adjacent intersection lines 32 and parts of the contour of the filter polygon 31 which are parallel to an x-axis, x. A similar algorithm has been described in connection with resistance splitting of networks in M. Horowitz et al., IEEE Transaction on Computer Aided Design, Vol CAD-2, No. 3, July 1993, pp. 145, in which the form of an interconnect whose resistance is to be calculated is split into partitioning cells with the aid of this algorithm.

The step-by-step partitioning of a filter polygon 41 is explained below with reference to FIGS. 4 to 7.

First partitioning cells are defined in the filter polygon 41 by means of superposition with interconnection lines parallel to a y-axis, y. The first partitioning cells 42 have a greater extent parallel to an x-axis, x than parallel to a y-axis, y. The first partitioning cells 42 are bounded parallel to the x-axis, x by parts of the contour of the filter polygon 41.

In the next step, the first partitioning cells 42 are stored in a file and the residual polygons of the filter polygon 41 are merged together. This is understood to mean that the first partitioning cells 42 are filtered out.

Afterward, the filter polygon 41 is rotated through 90° in the clockwise direction. By means of superposition with intersection lines running parallel to the y-axis y, second partitioning cells 43 are produced. The second partitioning cells 43 have a dimension parallel to the x-axis, x' in the rotated coordinate system, which is larger than the dimension that is parallel to the y-axis, y' in the rotated coordinate system. Since the dimensions of the filter polygon 41 that are along the x-axis, x' have been rotated through 900 relative to the dimensions of the filter polygon 41 that are along the x-axis, x in FIG. 4, the first partitioning cells 42 are arranged perpendicular to the second partitioning cells 43 (see FIG. 5).

The second partitioning cells 43 are filtered out and stored. Afterward, the first partitioning cells 42 are further subdivided by the second partitioning cells 43, provided that the first partitioning cells 42 and the second partitioning cells 43 touch one another. This results in third partitioning cells 44, which adjoin both the adjacent first partitioning cell 42 and the adjacent second partitioning cell 43 (see FIG. 6).

The residual polygons are examined with respect to whether they can be split into further rectangles. These rectangles are stored as fourth partitioning cells 45 and filtered out (see FIG. 6).

The residual polygons are further subdivided by superposition with intersection lines at discontinuities of their contours. This results in fifth partitioning cells 46, which are stored (see FIG. 7).

Afterward, a check is made to determine whether there are any partitioning cells whose dimension exceeds a maximum dimension l=25 $\mu$m. Partitioning cells which exceed this maximum dimension are subdivided into n=L/l rectangles or trapezoids, where L is the length of the original partitioning cell. As a result, all that remain are rectangles or trapezoids whose length is less than or equal to l.

Partitioning cells whose length is less than a minimum dimension of 15 $\mu$m, for example, are merged with adjacent partitioning cells. If the dimension of the resulting partitioning cell is greater than the maximum dimension, then this partitioning cell is subdivided into two partitioning cells of essentially the same size.

In order to fabricate an integrated circuit, proceeding from a circuit design SE, a layout LO is created with the aid of a computer (see FIG. 8). With the aid of an extraction program EP, to which rules for network extraction NE are available, the coordinates of interconnection networks are extracted from the layout L and stored in a database DB. A filter polygon is determined for a selected interconnection network using a program for creating a filter polygon and for partitioning PFP. Furthermore, the filter polygon is split into partitioning cells using the program for defining the filter polygon and for partitioning PFP. The information for selecting the interconnection network, for defining the filter polygon and for partitioning is taken from a parameter file PD. The parameter file PD contains, in particular, a predeterminable extent w by which the filter polygon is enlarged relative to the contour of the selected interconnection network, and also a maximum dimension l and a minimum dimension for the partitioning cells.

The rest of the program sequence takes place in parallel for the partitioning cells PZi, i=1, 2 . . . n. The portions of other interconnection networks which overlap the partitioning cell PZi are determined for each partitioning cell PZi. This step, which is referred to as 3D modelling 3DM takes place on the basis of the database DB. Afterward, for each partitioning cell PZi, the capacitance of the selected interconnection network with respect to the portions of other interconnection networks which overlap the partitioning cell PZi is calculated. This calculation is effected by a program referred to as field solver FS.

The results of the capacitance calculation for the partitioning cells PZi, i=1, 2 . . . n, are output as a capacitance list KL. The capacitance list KL can be output in a format which can be processed by an analog circuit simulator. Such a format is familiar under the name SPICE network list.

Afterward, the calculated capacitances of the capacitance list KL are compared with the capacitances of the circuit design SE in a comparison step VS. This comparison is effected for example using the time response of signals which is demanded in the circuit design SE. In a test step P, a check is made to determine whether there is correspondence between the calculated capacitance of the capacitance list KL and the capacitance of the circuit design SE. If the capacitances do not correspond, then the layout LO is modified in an optimization step O. Proceeding from the modified layout LO, the verification method is then carried out again. If the capacitance values correspond, then the mask fabrication MH is carried out based on the verified layout. All the required mask sets for technological realization of the integrated circuit are produced in this case. The fabrication HIS of the integrated circuit takes place using the masks fabricated in this way.

FIG. 9 reveals the dependence of the calculated capacitance C on the length l of the partitioning cell. Without partitioning, that is to say for infinite l, a capacitance of 10.3 fF is produced. FIG. 9 reveals that, for a partitioning cell length greater than 25 $\mu$m, the inaccuracy of the capacitance is at most 5%. The extent w by which the filter polygon is enlarged on both sides relative to the selected interconnection network is 5 $\mu$m.

We claim:

1. A method for verifying a layout of an integrated circuit, which comprises:

providing a layout containing a plurality of interconnection networks;

selecting one of the plurality of the interconnection networks that are contained in the layout and thereby obtaining a selected interconnection network, the selected interconnection network having dimensions; and calculating a capacitance of the selected interconnection network with respect to others of the plurality of the interconnection networks that are contained in the layout by performing the following steps:

determining a filter polygon that surrounds the dimensions of the selected interconnection network;

providing the filter polygon with dimensions that are enlarged by a predetermined extent relative to the dimensions of the selected interconnection network;

determining portions of others of the plurality of the interconnection networks that overlap the filter polygon; and determining a capacitance between the selected interconnection network and the portions of the others of the interconnection networks that overlap the filter polygon.

2. The method according to claim 1, which comprises:

comparing the dimensions of the filter polygon with a predetermined maximum dimension;

if one of the dimensions of the filter polygon is larger than the predetermined maximum dimension, then:

splitting the filter polygon into partitioning cells having dimensions that do not exceed the maximum dimension; and for each one of the partitioning cells, calculating a capacitance between the selected interconnection network and portions of others of the plurality of the interconnection networks which overlap the respective one of the partitioning cells.

3. The method according to claim 2, which comprises:

storing coordinates of the selected interconnection network in a computer as a network list; and for each one of the partitioning cells, generating a file that contains information about a geometry of the respective one of the partitioning cells and about an overlap with the others of the plurality of the interconnection networks.

4. The method according to claim 2, which comprises:

performing the step of splitting the filter polygon by using vertical and horizontal lines of intersection which in each case intersect discontinuity points in a contour of the filter polygon.

5. The method according to claim 4, which comprises combining one of the partitioning cells that has dimensions which are smaller than a predetermined minimum dimension with an adjacent partitioning cell.

6. The method according to claim 1, which comprises:

selecting a plurality of the plurality of the interconnection networks that are contained in the layout and thereby obtaining a plurality of selected interconnection networks, each of the plurality of the selected interconnection networks having dimensions; and for each respective one of the plurality of the selected interconnection networks, calculating a capacitance with respect to all others of the plurality of the interconnection networks that are contained in the layout by performing the following steps:

determining a filter polygon that surrounds the dimensions of the respective one of the plurality of the selected interconnection networks and providing the filter polygon with dimensions that are enlarged by a predetermined extent relative to the dimensions of the respective one of the plurality of the selected interconnection networks;

determining portions of all others of the plurality of the interconnection networks that overlap the respective one of the plurality of the selected interconnection networks; and determining a capacitance between the respective one of the plurality of the selected interconnection networks and the portions of all others of the plurality of the interconnection networks which overlap the respective one of the plurality of the selected interconnection networks.

7. A method for fabricating an integrated circuit, which comprises:

using a computer to create a layout from a circuit design in which the layout has a plurality of interconnection networks having dimensions;

selecting one of the plurality of the interconnection networks to thereby obtain a selected interconnection network;

using the computer to verify the layout for the selected interconnection network by calculating a capacitance of the selected interconnection network with respect to others of the plurality of the interconnection networks and calculating the capacitance by performing the following steps:

determining a filter polygon that surrounds the dimensions of the selected interconnection network;

providing the filter polygon with dimensions that are enlarged by a predetermined extent relative to the dimensions of the selected interconnection network;

determining portions of others of the plurality of the interconnection networks that overlap the filter polygon;

determining a capacitance between the selected interconnection network and the portions of the others of the plurality of the interconnection networks that overlap the filter polygon; and comparing the determined capacitance with the circuit design and optimizing the layout in an event of a deviation; and after the layout has been verified, fabricating a mask set and using the mask set to fabricate an integrated circuit.

8. The method according to claim 7, which comprises:

comparing the dimensions of the filter polygon with a predetermined maximum dimension;

if one of the dimensions of the filter polygon is larger than the predetermined maximum dimension, then:

splitting the filter polygon into partitioning cells having dimensions that do not exceed the maximum dimension; and for each one of the partitioning cells, calculating a capacitance between the selected interconnection network and portions of others of the plurality of the interconnection networks which overlap the respective one of the partitioning cells.

9. The method according to claim 8, which comprises:

storing coordinates of the selected interconnection network in a computer as a network list; and for each one of the partitioning cells, generating a file that contains information about a geometry of the respective one of the partitioning cells and about an overlap with the others of the plurality of the interconnection networks.

10. The method according to claim 8, which comprises:

performing the step of splitting the filter polygon by using vertical and horizontal lines of intersection which in each case intersect discontinuity points in a contour of the filter polygon.

11. The method according to claim 10, which comprises combining one of the partitioning cells that has dimensions which are smaller than a predetermined minimum dimension with an adjacent partitioning cell.

12. The method according to claim 7, which comprises:

selecting a plurality of the plurality of the interconnection networks that are contained in the layout and thereby obtaining a plurality of selected interconnection networks, each of the plurality of the selected interconnection networks having dimensions; and for each respective one of the plurality of the selected interconnection networks, calculating a capacitance with respect to all others of the plurality of the interconnection networks that are contained in the layout by performing the following steps:

determining a filter polygon that surrounds the dimensions of the respective one of the plurality of the selected interconnection networks and providing the filter polygon with dimensions that are enlarged by a predetermined extent relative to the dimensions of the respective one of the plurality of the selected interconnection networks;

determining portions of all others of the plurality of the interconnection networks that overlap the respective one of the plurality of the selected interconnection networks; and determining a capacitance between the respective one of the plurality of the selected interconnection networks and the portions of all others of the plurality of the interconnection networks which overlap the respective one of the plurality of the selected interconnection networks.

13. A configuration for using a computer to verify a layout of an integrated circuit, comprising:

a processor unit configured to calculate a capacitance in a layout, the layout containing a plurality of interconnection layouts which include a selected interconnection network having dimensions, the capacitance being a capacitance of the selected interconnection network with respect to others of the plurality of the interconnection networks;

the processor unit including means for determining a filter polygon that surrounds the dimensions of the selected interconnection network such that dimensions of the filter polygon are enlarged by a predetermined extent relative to the dimensions of the selected interconnection network; the processor unit including means for determining portions of other interconnection networks that overlap the filter polygon; and the processor unit including means for determining capacitance between the selected interconnection network and the portions of the other interconnection networks which overlap the filter polygon.

14. The configuration according to claim 13, comprising:

a plurality of processor units, each one of the plurality of the processor units configured to calculate, for a respective one of a plurality of selected interconnection networks having dimensions and being contained in the layout, a capacitance with respect to all others of the plurality of the interconnection networks contained in the layout by performing the following functions:

determining a filter polygon that surrounds the dimensions of the respective one of the plurality of the selected interconnection networks and providing the filter polygon with dimensions that are enlarged by a predetermined extent relative to the dimensions of the respective one of the plurality of the selected interconnection networks;

determining portions of all others of the plurality of the interconnection networks that overlap the respective one of the plurality of the selected interconnection networks; and determining a capacitance between the respective one of the plurality of the selected interconnection networks and the portions of all others of the plurality of the interconnection networks which overlap the respective one of the plurality of the selected interconnection networks.

* * * * *